(12) United States Patent
Lee et al.

(10) Patent No.: US 11,592,475 B1
(45) Date of Patent: Feb. 28, 2023

(54) SYSTEM AND METHOD FOR TESTING RADIATION SUSCEPTIBILITY CAPABLE OF SIMULATING IMPACT OF A RADIATION WAVE TO A DEVICE UNDER TEST

(71) Applicants: Inventec (Pudong) Technology Corp., Shanghai (CN); Inventec Corporation, Taipei (TW)

(72) Inventors: Yung-Sen Lee, Taipei (TW); I-Lin Tsai, Taipei (TW)

(73) Assignees: Inventec (Pudong) Technology Corp., Shanghai (CN); Inventec Corporation, Taipei (TW)

(*) Notice: Subject to any disclaimer, the term of this patent is extended or adjusted under 35 U.S.C. 154(b) by 0 days.

(21) Appl. No.: 17/548,584

(22) Filed: Dec. 12, 2021

(30) Foreign Application Priority Data

Nov. 19, 2021 (CN) .......................... 202111373220.5

(51) Int. Cl.
*G01R 31/28* (2006.01)
(52) U.S. Cl.
CPC ....... *G01R 31/2879* (2013.01); *G01R 31/287* (2013.01); *G01R 31/2884* (2013.01)
(58) Field of Classification Search
CPC .............. G01R 31/2879; G01R 31/287; G01R 31/2884

USPC .................................................. 324/500, 537
See application file for complete search history.

(56) References Cited

U.S. PATENT DOCUMENTS

| | | | | |
|---|---|---|---|---|
| 5,365,068 A * | 11/1994 | Dickerson | ............. | G01J 1/4204 340/600 |
| 7,805,545 B2 * | 9/2010 | Souders | .................. | G06F 11/00 700/79 |
| 8,466,707 B2 * | 6/2013 | Mohammad | ........... | G11C 29/12 324/762.01 |

\* cited by examiner

*Primary Examiner* — Giovanni Astacio-Oquendo
(74) *Attorney, Agent, or Firm* — Winston Hsu (57) ABSTRACT

Abstract of Disclosure A method for testing radiation susceptibility includes transmitting radiation wave to a device under test, measuring the device under test to generate a first voltage according to the radiation wave, outputting a reference voltage to a coupling device so that the coupling device generates a second voltage according to the reference voltage, adjusting the reference voltage so that the second voltage approximates the first voltage, storing the adjusted reference voltage, outputting the second voltage to the device under test according to the adjusted reference voltage to simulate an impact of the radiation wave to the device under test, the device under test accordingly transmitting a control signal to the coupling device after receiving the second voltage, and determining a status of the device under test according to the control signal.

10 Claims, 5 Drawing Sheets

SYSTEM AND METHOD FOR TESTING RADIATION SUSCEPTIBILITY CAPABLE OF SIMULATING IMPACT OF A RADIATION WAVE TO A DEVICE UNDER TEST

BACKGROUND OF THE INVENTION

1. Field of the Invention

The disclosure is related to a system and a method for testing radiation susceptibility, and more particularly, a system and a method for testing radiation susceptibility used for simulating an impact of a radiation wave to a device under test.

2. Description of the Prior Art

For electronic devices, such as computers or servers, radiation susceptibility (RS) testing is highly important. Since electromagnetic fields are ubiquitous, if an electronic device fails to pass the radiation susceptibility test, the device may be disturbed by radiated waves and cause functional failure and damage.

At present, in order to test the radiation susceptibility, an electronic device must be placed in an anechoic chamber or an antenna chamber. A radiation wave is transmitted to the electronic device, and then the impact on the electronic device can be measured. If the result is not passed, the engineer must enter the anechoic chamber to adjust related settings, and then perform the relevant operations repeatedly for analysis or debugging by means of trial-and-error.

This process consumes a lot of resources of space and operation time, and it is difficult to find out the root cause of the error. In addition, because engineers must enter high-radiation areas frequently, it is harmful to the safety and health of the engineers.

Furthermore, for a simple test that does not require a formal radiation susceptibility verification test, such as a test related to a simple engineering prediction or a comparison of results, if the simple test is still performed in an anechoic chamber, the used resources and costs are almost equivalent to that of a formal radiation susceptibility verification test, and using the anechoic chamber leads to excessive cost. Therefore, it is necessary to have a system and a method for radiation susceptibility test without using an anechoic chamber for facilitating the analysis or debugging by engineers.

SUMMARY OF THE INVENTION

An embodiment provides a system for testing radiation susceptibility, including a peripheral control device, a coupling device, a signal generator and a device under test. The peripheral control device is used to determine a status of a device under test according to a data signal and a first control signal, and includes a first terminal used to transceive the first control signal, and a second terminal used to transceive the data signal corresponding to a reference voltage. The coupling device includes a first terminal used to receive the reference voltage, a second terminal used to output a second voltage corresponding to a first voltage according to the reference voltage and transceive a second control signal corresponding to the first control signal, and a third terminal coupled to the first terminal of the peripheral control device and used to transceive the first control signal. The signal generator includes a first terminal coupled to the first terminal of the coupling device and used to output the reference voltage, and a second terminal coupled to the second terminal of the peripheral control device and used to transceive the data signal. The device under test is coupled to the second terminal of the coupling device and is used to receive the second voltage and transceive the second control signal. The first voltage is measured when a radiation wave is transmitted to the device under test, and the reference voltage has been adjusted so that the second voltage approximates the first voltage for simulating impact of the radiation wave to the device under test.

Another embodiment provides a method for testing radiation susceptibility, including transmitting a radiation wave to a device under test; measuring the device under test to generate a first voltage according to the radiation wave; outputting a reference voltage to a coupling device so that the coupling device generates a second voltage according to the reference voltage; adjusting the reference voltage so that the second voltage approximates the first voltage; storing the adjusted reference voltage; outputting the second voltage to the device under test according to the adjusted reference voltage to simulate an impact of the radiation wave to the device under test; the device under test accordingly transmitting a control signal to the coupling device after receiving the second voltage; and determining a status of the device under test according to the control signal.

These and other objectives of the present invention will no doubt become obvious to those of ordinary skill in the art after reading the following detailed description of the preferred embodiment that is illustrated in the various figures and drawings.

DETAILED DESCRIPTION

In order to deal with the problem mentioned above, embodiments can provide a system and a method for testing radiation susceptibility as below.

According to an embodiment, an antenna can transmit a radiation wave to a device under test in an antenna chamber or an anechoic chamber, and the device under test can be measured to generate a corresponding first voltage. According to the frequencies of the radiation waves transmitted by the antenna, a plurality of first voltages corresponding to a plurality of measurement frequencies (e.g., 100 MHz, 125 MHz, 250 MHz, 400 MHz, 1,000 MHz, etc.) between 80 MHz and 1,000 MHz can be measured from the device under test. Afterward, a signal generator can provide a reference voltage, and a coupling device can generate and output a second voltage to the device under test according to the reference voltage. The reference voltage generated by the signal generator can be adjusted so that the second voltage can approximate the first voltage. The adjusted reference voltage can be stored for further use. The reference voltages corresponding to all measurement frequencies can be stored in a database. Then, it is no longer necessary to use the antenna chamber, and the stored reference voltage can be transmitted to the coupling device to generate the second voltage, where the second voltage can be applied to the device under test to simulate the impact of the radiation wave.

Figure 1:
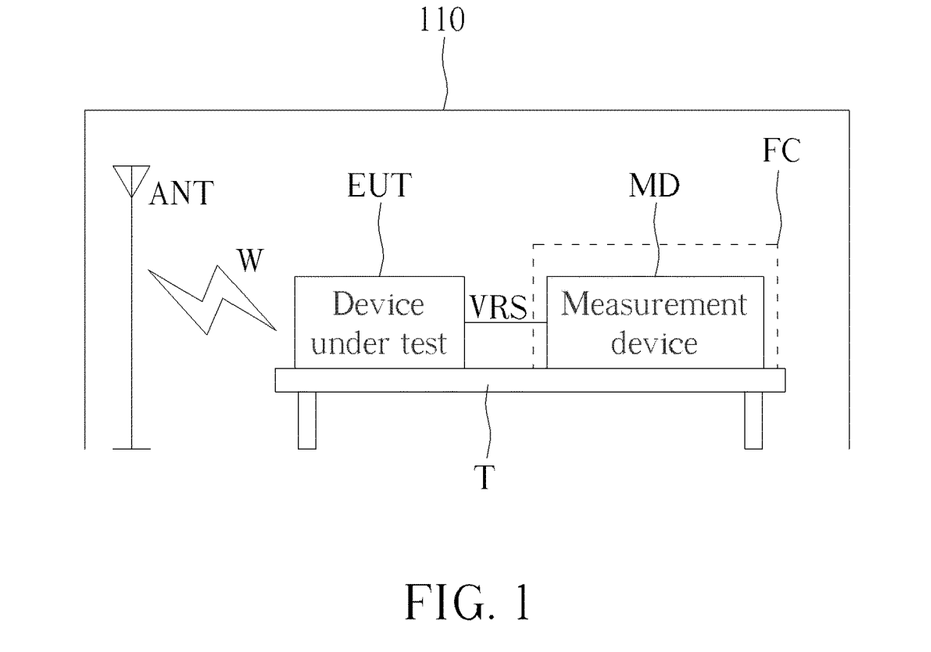
FIG. 1 illustrates a radiation wave transmitted to a device under test according to an embodiment.
Figure 2:
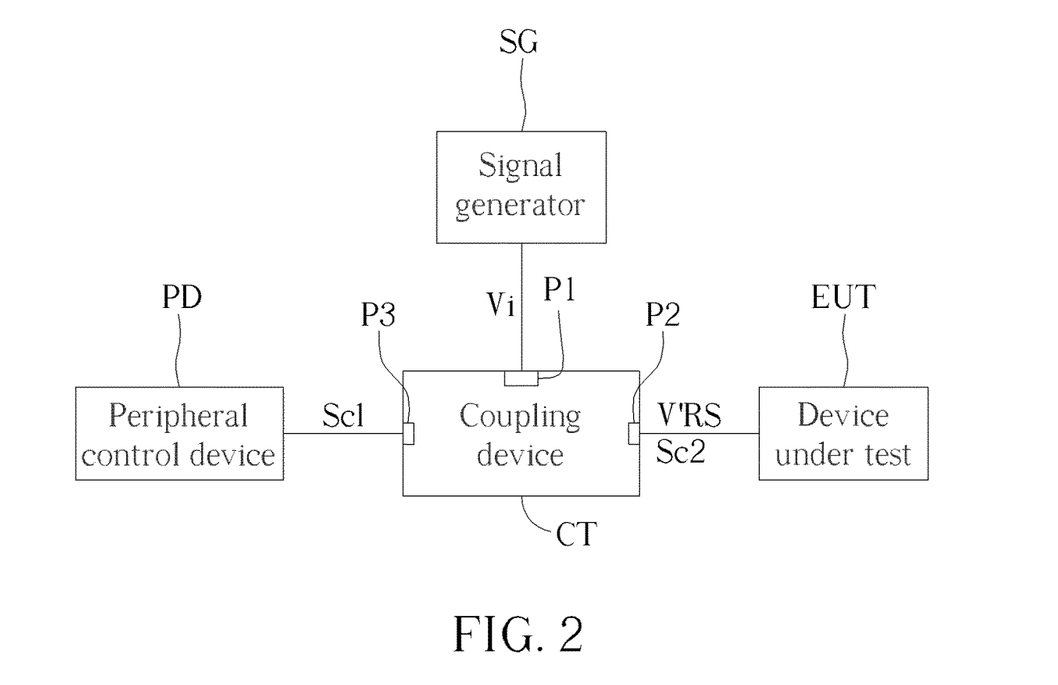
FIG. 2 illustrates a coupling device used to simulate an impact of the radiation wave to the device under test in FIG. 1.
Figure 3:
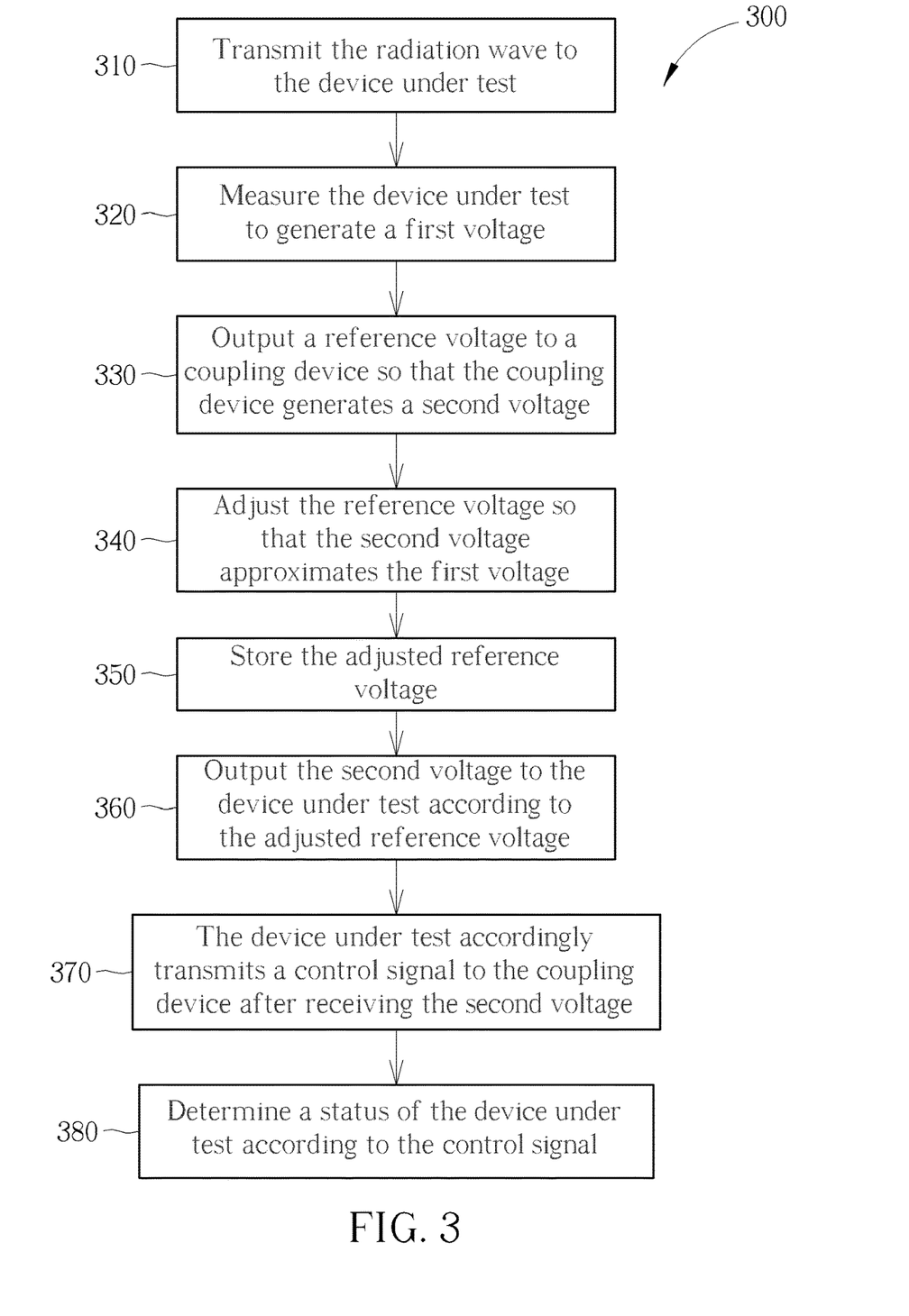
FIG. 3 illustrates a method for testing radiation susceptibility according to an embodiment.

FIG. 1 illustrates a radiation wave W transmitted to a device under test EUT according to an embodiment. FIG. 2 illustrates a coupling device used to simulate an impact of the radiation wave W to the device under test EUT according to an embodiment. FIG. 3 illustrates a method 300 for testing radiation susceptibility according to an embodiment. FIG. 1 can be related to Steps 310 and 320 of FIG. 3, and FIG. 2 can related to Steps 330 to 380 of FIG. 3. As shown in FIG. 1 to FIG. 3, the method 300 can include the following steps.

Step 310: transmit the radiation wave W to the device under test EUT;

Step 320: measure the device under test EUT to generate a first voltage VRS according to the radiation wave W;

Step 330: output a reference voltage Vi to a coupling device CT so that the coupling device CT generates a second voltage V'RS according to the reference voltage Vi;

Step 340: adjust the reference voltage Vi so that the second voltage V'RS approximates the first voltage VRS;

Step 350: store the adjusted reference voltage Vi;

Step 360: output the second voltage V'RS to the device under test EUT according to the adjusted reference voltage Vi to simulate the impact of the radiation wave W to the device under test EUT;

Step 370: the device under test EUT accordingly transmits a control signal Sc2 to the coupling device CT after receiving the second voltage V'RS; and Step 380: determine a status of the device under test EUT according to the control signal Sc2.

As shown in FIG. 1, Steps 310 and 320 can be performed in the antenna chamber 110, where the radiation wave W transmitted by the antenna ANT can have a predetermined frequency. For example, the measurement device MD can be an oscilloscope, such as a digital oscilloscope (DSO). In FIG. 1, the measurement device MD can be placed in a Faraday cage FC to avoid being affected by the radiation wave. The device under test EUT can include a network cable and a network connector. For example, the network cable can include a CAT 5E cable, and the network connector can include an RJ45 LAN connector. Hence, the radiation susceptibility of a network cable and a network connector can be tested. According to an embodiment, the measurement device MD and the device under test EUT can be located on a working table T. The working table T can be non-conductive to comply with the test-related specifications. For example, the working table T can be a wooden table.

Figure 4:
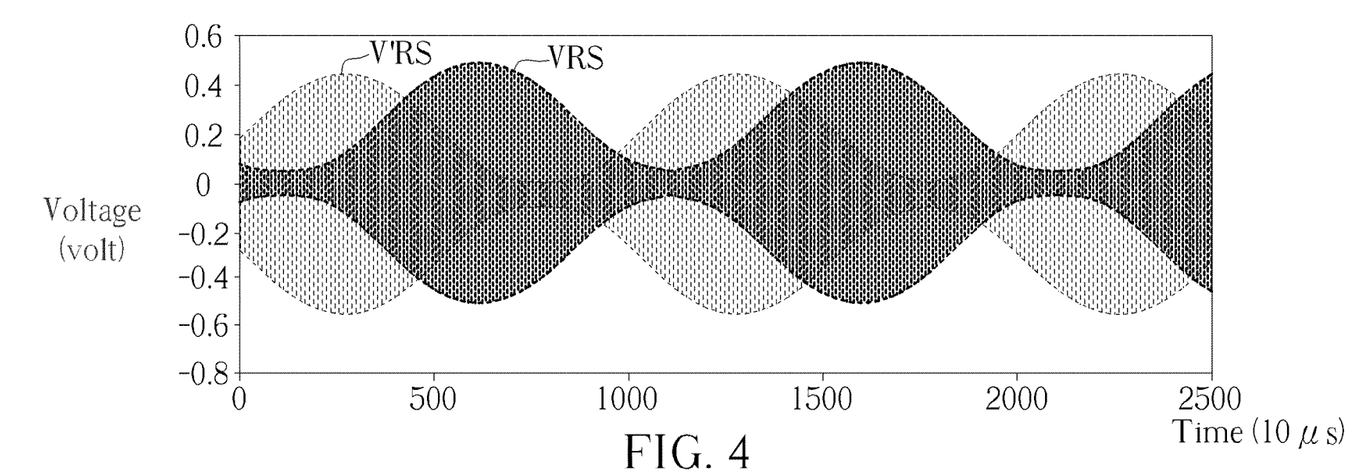
FIG. 4 and FIG. 5 illustrate the first voltage and the second voltage according to different embodiments.
Figure 5:
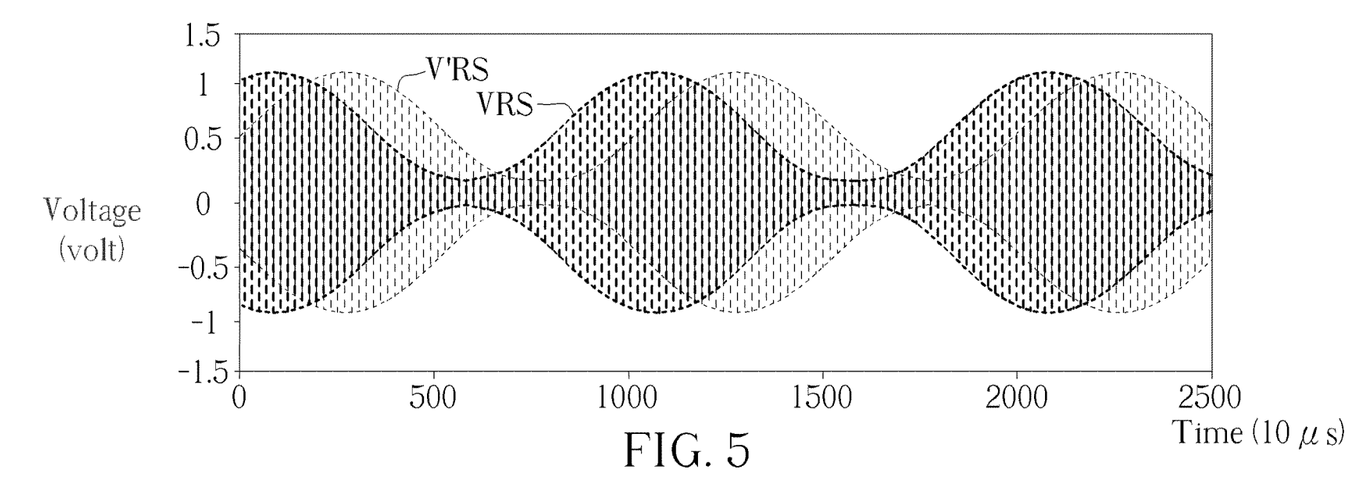

According to measurements and calculations, it is confirmed the second voltage V'RS can simulate the first voltage VRS with only a phase difference between the waveforms of the voltages. Hence, it is feasible and accurate to use the second voltage V'RS to simulate the impact of the radiation wave W. FIG. 4 and FIG. 5 illustrate the first voltage VRS and the second voltage V'RS according to different embodiments. In FIG. 4 and FIG. 5, the horizontal axis corresponds to time with a unit such as 10 microseconds (μs), and the vertical axis corresponds to voltage with a unit such as volt (V). For example, FIG. 4 can be corresponding the radiation wave of about 100 MHz, and FIG. 5 can be corresponding the radiation wave of about 125 MHz. Due to the high frequency, the details of the waveforms of FIG. 4 and FIG. 5 cannot be completely shown. However, as shown in FIG. 4 and FIG. 5, the waveforms and voltage levels of the first voltage VRS and the second voltage V'RS may be almost the same, and there is only a phase difference between the waveforms of the two voltages. Because the phase difference can be easily processed during the post-processing procedure, as shown in FIG. 4 and FIG. 5, the solution provided by embodiments can use the second voltage V'RS to simulate the first voltage VRS, thereby simulating the impact of the radiation wave W to the device under test EUT.

As shown in FIG. 2, in Steps 330 to 350, the second voltage V'RS can be generated by using the coupling device CT and the signal generator SG for simulating the impact of the radiation wave W. As shown in FIG. 2, the coupling device CT can include a first terminal P1, a second terminal P2 and a third terminal P3. The first terminal P1 can receive the reference voltage Vi. The second terminal P2 can output the second voltage V'RS corresponding to the first voltage VRS (shown in FIG. 1) according to the reference voltage Vi. The third terminal P3 can be coupled to the peripheral control device PD to transceive a control signal Sc1. The control signal Sc1 is further described below. Since the coupling device CT has the first terminal P1 to the third terminal P3, the coupling device CT can be regarded as a three-port coupling device.

The signal generator SG can be coupled to the first terminal P1 of the coupling device CT to output the reference voltage Vi. The device under test EUT can be coupled to the second terminal P2 of the coupling device CT to receive the second voltage V'RS. According to an embodiment, the second voltage V'RS can be positively related to a sum of the first voltage VRS and a correction factor CF. For example, this can be expressed as equation eq-1:

$$Vi = V'RS + CF \ldots \qquad \text{eq-1.}$$

As shown in Steps 340 and 350, because the first voltage VRS has been generated in Step 320, the signal generator SG can adjust the reference voltage Vi to a proper level for the second voltage V'RS to approximate the first voltage VRS. For example, the difference between the first voltage VRS and the second voltage V'RS can be less the 10%, 5% or 1% of the first voltage VRS. As mentioned in Step 360, the second voltage V'RS can be outputted to the device under test EUT according to the adjusted reference voltage Vi to simulate the impact of the radiation wave W to the device under test EUT.

According to an embodiment, Steps 310 to 350 can be performed repeatedly to generate the reference voltages Vi corresponding to different frequencies. For example, in Step 310, the radiation wave W can have a first frequency, so the adjusted reference voltage Vi can be corresponding to the first frequency. Then, the radiation wave W can be adjusted from the first frequency to a second frequency for further generating the reference voltage Vi corresponding to the second frequency, and so forth.

By means of a plurality of calibrations and operations, a lookup table of multiple frequencies and reference voltages Vi can be generated. Afterward, when planning to apply the radiation wave W with a predetermined frequency to the device under test EUT, the corresponding reference voltage Vi can be directly used for outputting the second voltage V'RS to the device under test EUT to perform the simulation as shown in FIG. 2. For example, the plurality of frequencies corresponding to the reference voltages Vi of the lookup table can be between tens to hundreds of megahertz (MHz), but lower than 1 gigahertz (GHz) to avoid the excessive ratio of noise caused by overly high frequency. According to an embodiment, a local area network (LAN) can be used to transmit data among the peripheral control device PD, the coupling device CT and the device under test EUT.

Figure 6:
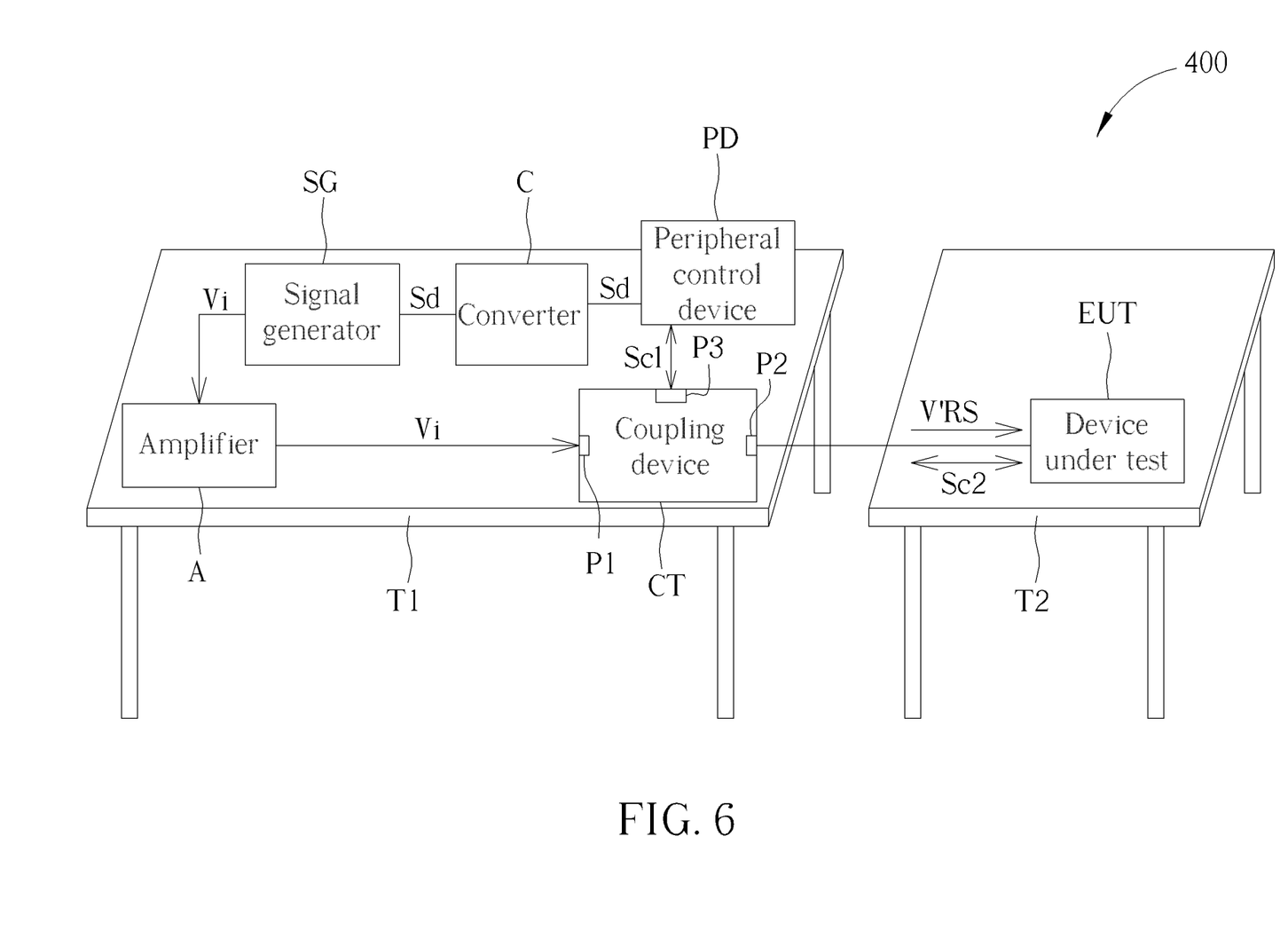
FIG. 6 illustrates a system for testing radiation susceptibility according to an embodiment.

FIG. 6 illustrates a system 400 for testing radiation susceptibility according to an embodiment. The system 400 can be corresponding to Steps 360 to 380 of FIG. 3, and related details about operations are described below. The system 400 can include the coupling device CT, the signal generator SG, the device under test EUT and the peripheral control device PD shown in FIG. 2. However, the system 400 shown in FIG. 6 does not need to include the measurement device MD shown in FIG. 1.

In the system 400, the peripheral control device PD can test the device under test EUT according to the data signal Sd and the control signal Sc1 to determine the status of the device under test EUT. The peripheral control device PD can include a first terminal and a second terminal, where the first terminal can transceive the control signal Sc1, and the second terminal can transceive the data signal Sd corresponding to the reference voltage Vi. The coupling device CT can include a first terminal, a second terminal and a third terminal, where the first terminal can receive the reference voltage Vi, the second terminal can output the second voltage V'RS corresponding to the first voltage VRS according to the reference voltage Vi and transceive a control signal Sc2 corresponding to the control signal Sc1, and the third terminal can be coupled to the first terminal of the peripheral control device PD to transceive the control signal Sc1. The signal generator SG can include a first terminal and a second terminal, where the first terminal can be coupled to the first terminal of the coupling device CT to output the reference voltage Vi, and the second terminal can be coupled to the second terminal of the peripheral control device PD to transceive the data signal Sd. The device under test EUT can be coupled to the second terminal of the coupling device CT to receive the second voltage V'RS and transceive the control signal Sc2. As mentioned above, the reference voltage Vi is adjusted so that the second voltage V'RS approximates the first voltage VRS for simulating the impact of the radiation wave W with a predetermined frequency to the device under test EUT.

According to an embodiment, the peripheral control device PD can include a desktop computer, a server, a laptop computer, a tablet computer and/or a computing device for performing related controls. For example, the peripheral control device PD can execute a remote control program to perform remote control or adjustment to the signal generator SG. The remote control program can include a database storing the reference voltages corresponding to all measurement frequencies, and the remote control program can be used to automatically and sequentially perform the tests related to the reference voltages corresponding to all measurement frequencies. According to an embodiment, the device under test EUT can include a network cable (e.g., a CAT cable) and a network connector. For example, the network cable can be a CAT 5E cable, and the network connector can be an RJ45 LAN connector. Hence, the radiation susceptibility of a network cable and a network connector can be tested.

As shown in FIG. 6, the system 400 can optionally include an amplifier A. The amplifier A can be coupled between the first terminal of the signal generator SG and the first terminal P1 of the coupling device CT to amplify the reference voltage Vi. As shown in FIG. 6, the system 400 can optionally include the converter C. The converter C can be coupled between the second terminal of the signal generator SG and the second terminal of the peripheral control device PD to connect a first interface corresponding to the signal generator SG and a second interface corresponding to the peripheral control device PD, where the first interface and the second interface are different. For example, the first interface can be a general purpose interface bus (GPIB), and the second interface can be a universal serial bus (USB).

As shown in FIG. 6, the system 400 can further include a first working table T1 and a second working table T2. The peripheral control device PD, the coupling device CT and the signal generator SG can be located on the first working table T1. The device under test EUT can be located on the second working table T2. The first working table T1 and the second working table T2 can be separated by a predetermined distance, and the first working table T1 and the second working table T2 can be formed with an insulation material, such as wood.

According to an embodiment, in the system 400, the first terminal of the peripheral control device PD and the third terminal of the coupling device CT can be coupled through a local area network (LAN) cable, and the second terminal of the coupling device CT and the device under test EUT can be coupled through another local area network cable. Hence, as shown in FIG. 6, the control signal Sc1, the second voltage V'RS and the control signal Sc2 can be transmitted through LAN cables.

According to an embodiment, the peripheral control device PD can transmit test data and correspondingly receive response data through the control signal Sc1 and the control signal Sc2 to determine the status of the device under test EUT corresponding to the reference voltage Vi. For example, when the signal generator SG outputs the reference voltage Vi, the peripheral control device PD can use the data signal Sd to look up the information such as the frequency of the simulated radiation wave corresponding to the reference voltage Vi.

For example, the peripheral control device PD can transmit a test packet through the control signal Sc1, and the coupling device CT can transmit the test packet to the device under test EUT through the control signal Sc2. If the device under test EUT can operate normally after receiving the second voltage V'RS, the device under test EUT can transmit a response packet to the coupling device CT, and the coupling device CT can transmit the response packet to the peripheral control device PD through the control signal Sc1 to notify the peripheral control device PD that the device under test EUT can still operate normally. In this situation, it can be determined that the device under test EUT can operate normally when the device under test EUT is impacted by the radiation wave.

In another condition, if the device under test EUT operates abnormally after receiving the second voltage V'RS, after the coupling device CT transmits the test packet to the device under test EUT, the device under test EUT should fail to send back the response packet within a predetermined time. Hence, according to the simulation result, the peripheral control device PD can determine that the device under test EUT operates abnormally after being impacted by the radiation wave.

As mentioned above, by means of the system 400 of FIG. 6, there is no need to use an oscilloscope and a probe to measure the device under test EUT. The impact of the radiation wave to the device under test EUT can be simulated and determined by means of the data signal Sd, the control signal S1 and the control signal S2. According to an embodiment, the control program and the hardware interface of the peripheral control device PD can be properly adjusted to perform the abovementioned operations.

Figure 7:
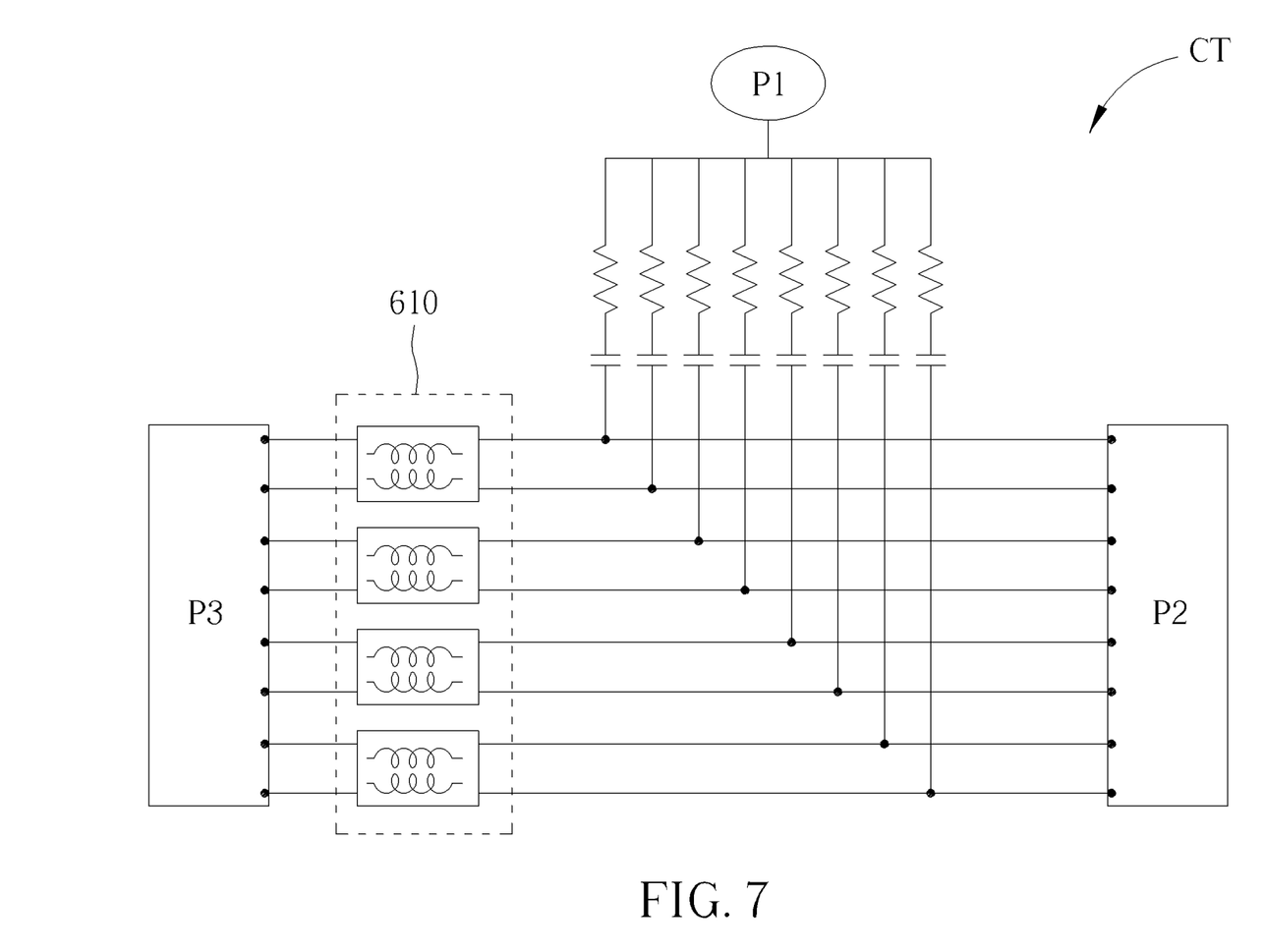
FIG. 7 illustrates the coupling device shown in FIG. 2 and FIG. 6.

FIG. 7 illustrates the coupling device CT shown in FIG. 2 and FIG. 6. According to an embodiment, the coupling device CT can include a set of capacitors and a set of resistors coupled to the first terminal P1 of the coupling device CT. The coupling device CT can further include a choke circuit 610 coupled to the third terminal P3 of the coupling device CT. For example, the choke circuit 610 can include a common mode choke. the choke circuit 610 can reduce or even block the interference of the second voltage V'RS to the peripheral control device PD. For example, an SMA (SubMiniature version A) connecter can be coupled to the first terminal P1 of the coupling device CT, a first RJ45 connecter can be coupled to the second terminal P2 of the coupling device CT, and a second RJ45 connecter can be coupled to the third terminal P3 of the coupling device CT. The external structure of the coupling device CT can be, for example, a cube with suitable heat dissipation holes. For example, the length, width, and height of the coupling device CT can be (but not limited to) 180 mm, 180 mm, and 50 mm, and the RJ45 connectors of the second terminal P2 and the third terminal P3 of the coupling device CT can be set on the same face of the cube. According to an embodiment, by modifying the coupling device CT, it is not limited to using RJ45 connectors, and other connectors, such as universal serial bus (USB) connectors, can be used. The circuit structure of FIG. 7 is an example, and the scope of embodiments is not limited thereto.

According to embodiment, the method 300 and the system 400 for testing radiation susceptibility can be used to test a server, and to simulate the problems of the server caused by the electromagnetic radiation interference without entering an antenna chamber. It is convenient for engineers to analyze, debug and solve the problem, improving the stability and reliability of the server. Hence, the server can be more suitable for artificial intelligence (AI) computing, edge computing, 5G communications, cloud calculation and storage, and vehicle-to-everything applications.

In summary, by means of the method 300 and the system 400 for testing radiation susceptibility, the initial measurements and calibrations can be performed in an antenna chamber. Afterward, the signal generator SG can generate reference voltage Vi correspondingly, so the second voltage V'RS can be accordingly generated to simulate the interference and impact of the radiation wave W to the device under test EUT. According to an embodiment, the system 400 can perform related simulation without using an oscilloscope and probe. Since it is no longer necessary to repeatedly enter the antenna chamber 110 for performing operations, it can improve the health and safety of user, reduce the cost of equipment and time, and improve the convenience of problem-shooting and fault analysis. Therefore, it is helpful for dealing with long-term problems in this field.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A system for testing radiation susceptibility, comprising:
   a peripheral control device configured to determine a status of a device under test according to a data signal and a first control signal, and comprising a first terminal configured to transceive the first control signal, and a second terminal configured to transceive the data signal corresponding to a reference voltage;
   a coupling device comprising a first terminal configured to receive the reference voltage, a second terminal configured to output a second voltage corresponding to a first voltage according to the reference voltage and transceive a second control signal corresponding to the first control signal, and a third terminal coupled to the first terminal of the peripheral control device and configured to transceive the first control signal;
   a signal generator comprising a first terminal coupled to the first terminal of the coupling device and configured to output the reference voltage, and a second terminal coupled to the second terminal of the peripheral control device and configured to transceive the data signal; and
   the device under test coupled to the second terminal of the coupling device and configured to receive the second voltage and transceive the second control signal;
   wherein the first voltage is measured when a radiation wave is transmitted to the device under test, and the reference voltage has been adjusted so that the second voltage approximates the first voltage for simulating impact of the radiation wave to the device under test.

2. The system for testing radiation susceptibility of claim 1, wherein the peripheral control device comprising a desktop computer, a server, a laptop computer, a tablet computer and/or a computing device.

3. The system for testing radiation susceptibility of claim 1, wherein the device under test comprises a network cable and a network connector.

4. The system for testing radiation susceptibility of claim 1, wherein the coupling device comprises:
   an SMA connecter coupled to the first terminal of the coupling device;
   a first RJ45 connecter coupled to the second terminal of the coupling device;
   a second RJ45 connecter coupled to the third terminal of the coupling device; and
   a choke circuit coupled to the third terminal of the coupling device.

5. The system for testing radiation susceptibility of claim 1, further comprising:
   an amplifier coupled between the first terminal of the signal generator and the first terminal of the coupling device, and configured to amplify the reference voltage.

6. The system for testing radiation susceptibility of claim 1, further comprising:
   a converter coupled between the second terminal of the signal generator and the second terminal of the peripheral control device, and configured to connect a first interface corresponding to the signal generator and a second interface corresponding to the peripheral control device, wherein the first interface and the second interface are different.

7. The system for testing radiation susceptibility of claim 1, further comprising a first working table and a second working table, wherein the peripheral control device, the coupling device and the signal generator are located on the first working table, the device under test is located on the second working table, the first working table and the second working table are separated by a predetermined distance, and the first working table and the second working table are formed with an insulation material.

8. The system for testing radiation susceptibility of claim 1, wherein the first terminal of the peripheral control device and the third terminal of the coupling device are coupled through a local area network (LAN) cable, and the second terminal of the coupling device and the device under test are coupled through another local area network cable.

9. The system for testing radiation susceptibility of claim 1, wherein the peripheral control device transmits test data and correspondingly receives response data through the first control signal and the second control signal to determine the status of the device under test corresponding to the reference voltage.

10. A method for testing radiation susceptibility, comprising:
- transmitting a radiation wave to a device under test;
- measuring the device under test to generate a first voltage according to the radiation wave;
- outputting a reference voltage to a coupling device so that the coupling device generates a second voltage according to the reference voltage;
- adjusting the reference voltage so that the second voltage approximates the first voltage;
- storing the adjusted reference voltage;
- outputting the second voltage to the device under test according to the adjusted reference voltage to simulate an impact of the radiation wave to the device under test;
- the device under test accordingly transmitting a control signal to the coupling device after receiving the second voltage; and
- determining a status of the device under test according to the control signal.

* * * * *